(12) United States Patent
Lin (10) Patent No.: US 6,304,127 B1
(45) Date of Patent: Oct. 16, 2001

(54) NEGATIVE-VOLTAGE-TRIGGER SCR WITH A STACK-GATE ESD TRANSIENT SWITCH

(75) Inventor: Shi-Tron Lin, Hsinchu (TW)

(73) Assignee: Winbond Electronics Corp. (JP)

( * ) Notice: Subject to any disclaimer, the term of this patent is extended or adjusted under 35 U.S.C. 154(b) by 0 days.

(21) Appl. No.: 09/126,197

(22) Filed: Jul. 30, 1998

(51) Int. Cl.[7] ........................................ G06F 7/24
(52) U.S. Cl. ........................ 327/321; 361/911; 361/111
(58) Field of Search ........................ 361/111, 56, 91.1; 257/357, 176, 356, 173; 327/310, 318, 321, 373

(56) References Cited

U.S. PATENT DOCUMENTS 5,670,799 * 9/1997 Croft ........................................ 257/173
5,808,342 * 9/1998 Chen et al. ............................. 257/357
5,982,601 * 11/1999 Lin ........................................ 361/111

* cited by examiner

Primary Examiner—Tuan T. Lam
Assistant Examiner—Hiep Nguyen
(74) Attorney, Agent, or Firm—Fulbright & Jaworski L.L.P.

(57) ABSTRACT

A transient negative voltage pump circuit pumps the ESD voltage to a negative voltage. The negative voltage with the ESD voltage are used for early triggering of an SCR structure on the integrated circuit. In one version of the present invention, a pn junction diode of the SCR device is used as part of the negative voltage pump circuit. This saves the layout area while improving the ESD performance. The present invention improves the ESD performance of an SCR ESD protection circuit which is used for protecting the power bus or an IC pin during an ESD event.

26 Claims, 6 Drawing Sheets

NEGATIVE-VOLTAGE-TRIGGER SCR WITH A STACK-GATE ESD TRANSIENT SWITCH

FIELD OF INVENTION

The invention relates to an ESD protection device employing a negative-voltage-trigger SCR.

BACKGROUND OF THE INVENTION

In a Human-Body-Model ESD transient, an 100 PF capacitor is first charged up to an ESD zapping voltage, and then discharges through a 1.5 kohms resistor onto an IC pin. For instance, a zapping voltage level of 2 KV is used to qualify an IC package. The initial peak current is roughly 1.2 A with a rise time of approximately 10 nsec. For integrated circuit packages, the VDD-to-VSS capacitance is typically larger than 1 nF. If the ESD energy is directly absorbed by the power bus, i.e. for ESD stress of VDD pin to VSS pin, or indirectly absorbed by the power bus, i.e. the positive ESD stress on an input or I/O pin that has a pull up device, then the voltage-rising rate inside an IC may reach 1 to 2 volt per nano-second for a Human-Body-Model ESD zapping at 2 to 3 KV level. The pull up device includes p+/nwell diode or PMOSFET.

Transistors, such as grounded-gate NMOS(GGNMOS), field-oxide MOSFET, output buffer transistors, or bipolar transistors, have been commonly used as primary ESD protection elements for integrated circuits. A Semiconductor Controlled Rectifier (SCR), typically including pnpn junctions, can also be used as primary ESD protection device for protecting an IC pin or a power bus during an ESD event. "ESD in Silicon Integrated Circuits" by A. Amerasekera and C. Duvvury, Chap. 3 and 4, John Wiley & Sons, 1995, provides a basic introduction for an SCR used as an ESD protection device.

Figure 1A:
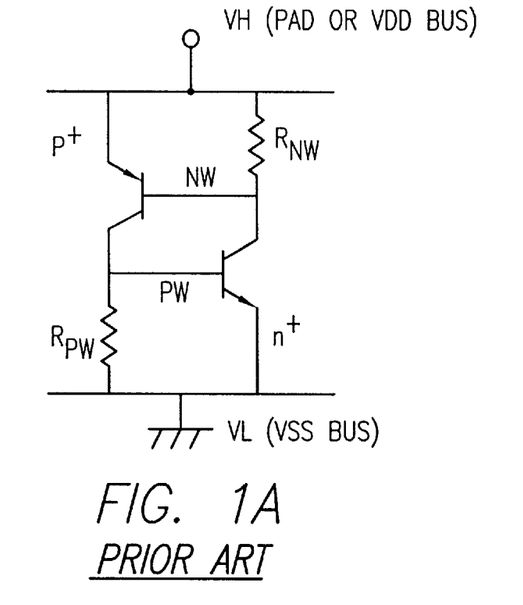
FIG. 1A and FIG. 1B show an SCR structure and FIG. 1C shows the cross section view of SCR.
Figure 1B:
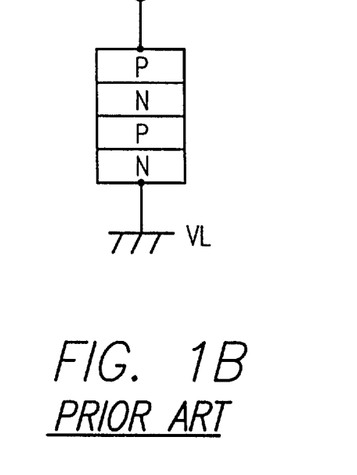
Figure 1C:
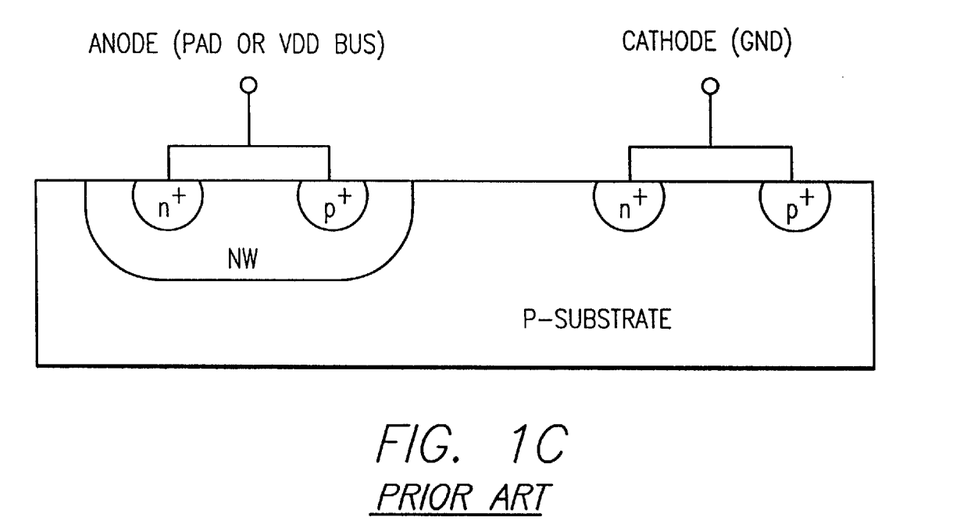

FIGS. 1A, 1B and 1C shows the basic structure of an SCR. The anode of an SCR can be connected to an IC pin, while the cathode of the SCR can be connected to ground, for ESD protection of an IC pin. Alternatively, the anode can be connected to VDD bus to prevent the internal circuit from being damaged during an ESD event from the power bus. The conventional SCR is triggered by the nwell to p-substrate junction breakdown, which is relatively high, for instance, typically >20V. This is a drawback when an SCR is used as an ESD protection element since it may not trigger sooner enough during an ESD event to protect other circuit elements from ESD damages.

Figure 2A:
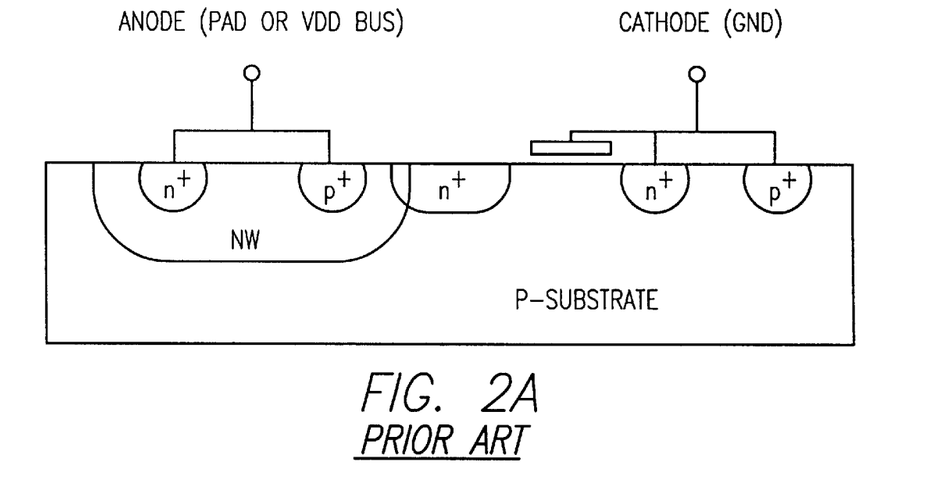
FIG. 2A shows the low voltage triggerinf SCR in accordance with U.S. Pat. No. 5,465,189.
Figure 2B:
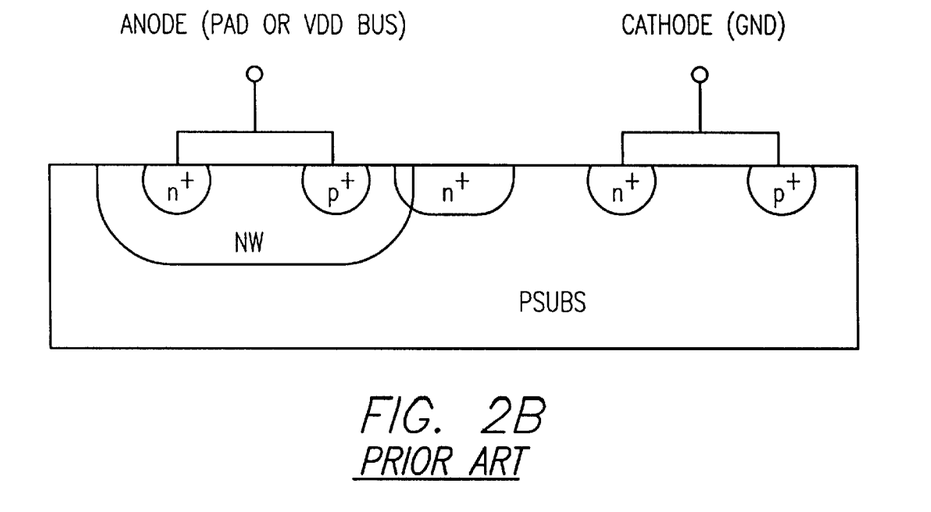
FIG. 2B shows the variation of FIG. 2B by utilizing integrated lateral bipolar device instead of MOSFET to trigger the SCR.

U.S. Pat. No. 5,465,189 describes an SCR used to provide on-chip protection against ESD stress applied at the input, output, power-supply bus, or between any arbitrary pair of pins of an integrated circuit. A novel structure in the patent having a low breakdown voltage is incorporated into the SCR to lower the trigger voltage of the SCR. FIG. 2A shows the low-voltage trigger SCR, according to U.S. Pat. No. 5,465,189, which integrates an NMOSFET with the SCR, such that the trigger voltage of the SCR is equal to the trigger voltage of an NMOSFET, which is typically roughly at or lower than 12 volts. FIG. 2B shows a variation of FIG. 2A in which an integrated lateral bipolar device, instead of NMOSFET, is provided to reduce the trigger voltage of an SCR.

Figure 3:
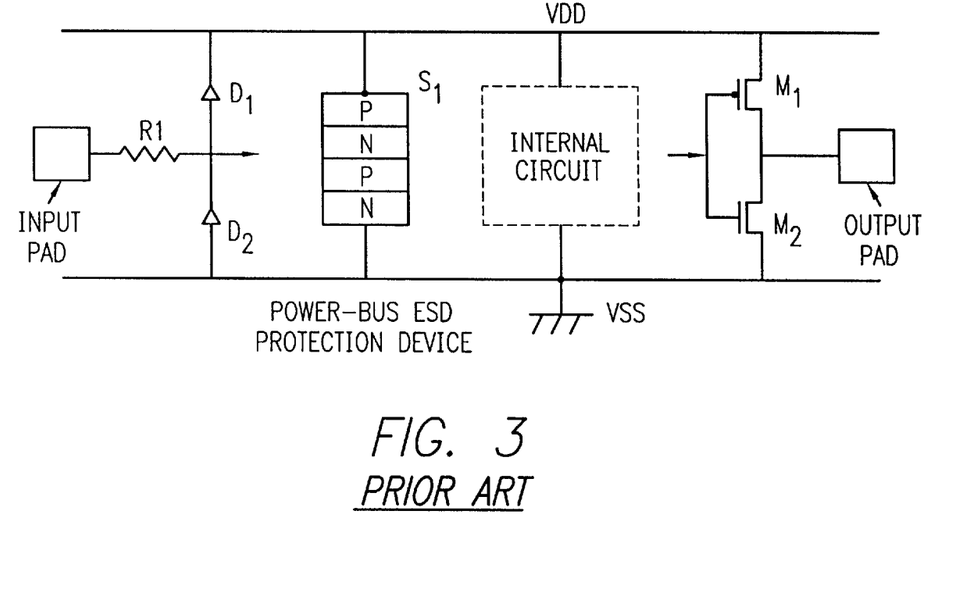
FIG. 3 shows a complete ESD protection scheme in accordance with the prior arts.

FIG. 3 shows an example of full-chip ESD protection scheme. The ESD protection of the input pin consists of a resistor R1, a diode D1 pull-up device, a diode D2 pull-down device. The ESD protection of an output pin relies on the output buffer, e.g. pull-up PMOS and pull-down NMOS, for self protection during an ESD event. Also shown in FIG. 3, the VDD bus potential can be pulled high through a pull-up p+/nwell diode or a pull-up PMOS. And similarly, the VSS bus potential can be pulled low through a pull-down n+/pwell diode or a pull-down NMOS. Therefore, the VDD to VSS voltage difference can be rapidly higher than 10 volt during an ESD events including the following situations: (i) positive stress of VDD pin to VSS pin, (ii) negative stress of VSS pin to VDD pin, (iii) positive stress on an input or I/O pin while the pin is connected to a pull-up (p+nwell) diode or a pull-up PMOS, or (iv) negative stress on an input or I/O pin while the pin is connected to a pull-down (n+/pwell) diode or a pull-down NMOS. Therefore, it is a common practice to include ESD protection elements, such as an SCR device S1, between VDD and VSS bus to protect the power bus and the internal circuit from being damaged during an ESD event.

It is of great advantage to lower the trigger voltage of an ESD protection device during an ESD event. As the ESD protection functions sooner, and the transient voltage imposed on the I/O and internal circuit can be lower which provides a better overall ESD protection.

Figure 4:
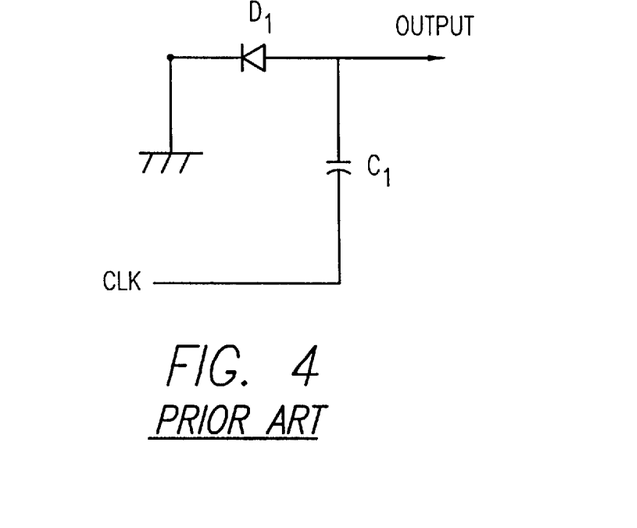
FIG. 4 illustrates prior art negative-voltage pump.

FIG. 4 discloses prior-art methods of negative voltage-pumping which generates a train of negative voltage pulses from positive VDD during circuit operation. As shown in FIG. 4, a negative voltage-pump circuit typically comprises at least one pn junction diode D1, for clamping the output voltage not to be higher than ground by 0.8 volts, such that a falling-edge clock signal can pump the output voltage to a negative voltage. The capacitor C1 acts as a capacitive coupling device in FIG. 4.

SUMMARY OF INVENTION

An electrostatic discharge (ESD) protection structure for an integrated circuit constructed on a substrate of a N type is provided.

The protection structure includes a semiconductor controlled rectifier (SCR) and a transient negative-voltage pumping circuit.

The semiconductor controlled rectifier (SCR) is constructed on the substrate and coupled to the integrated circuit, and the SCR includes a first region of a second type (pwell) formed within the substrate.

The transient negative voltage pumping circuit is coupled to the first region (pwell) while the ESD voltage is applied to the nwell. The transient negative voltage pumping circuit pumps the ESD voltage to a negative voltage during the ESD transient for earlier triggering the SCR during the ESD event.

DESCRIPTION OF THE PREFERRED EMBODIMENTS

Figure 5:
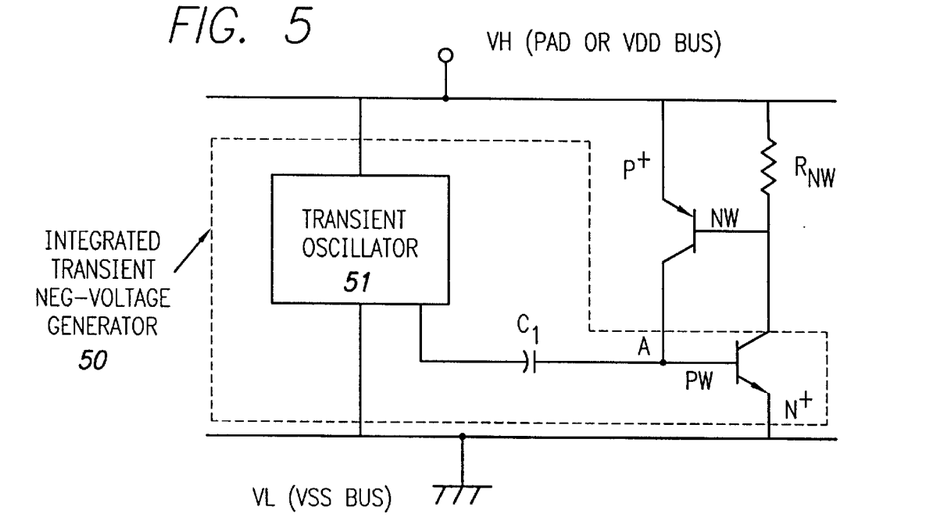
FIG. 5 shows embodiment of the invention.

Referring to FIG. 5, the embodiment of the invention has a transient negative voltage generator 50, including a transient oscillator 51, for pumping the ESD voltage to a negative voltage during the ESD transient. By incorporating the oscillator 51 with a capacitor C1 and the n+/pwell junction diode of the SCR structure, the present invention provides a negative voltage pumping circuit integrated with a portion of the SCR structure. The SCR is constructed on a base region and coupled to the integrated circuit. The provision saves the layout area while improving the ESD performance. The pumped negative voltage is applied to the SCR for early trigger of the SCR during an ESD event. FIG. 5 shows the output of the transient oscillation generator 51 is conncered to the pwell of the SCR, such that the voltage difference between pwell and nwell (or n-substrate) increases and the SCR triggers sooner during earlier ESD transient.

The SCR includes a first region of a second type formed next to the base region, a second region of the first type formed in the first region, and a third region of the second type formed in the base region. In particular, the voltage transition has ramp rate faster than the ESD transient voltage's ramp rate.

In a preferred embodiment, the first type is N type and the second type is P type.

As shown, the third region is coupled to a first bus electrically coupled to an ESD transient voltage source. And the first bus is a power bus.

Not shown in FIG. 5, a diode may be disposed between the first bus and an IC pin receiving the ESD transient voltage similar to that shown in FIG. 3. In an embodiment, the diode is a junction diode of a MOSFET.

In a preferred embodiment, the second region is coupled to a second bus which may be a ground bus.

In a preferred embodiment, the first region is a pwell, the second region is an n+ diffusion in the pwell, the third region is a p+ diffusion in the base region, and the base region is of N type.

In another embodiment, the first region is a first well of the second type, and the base region is a substrate.

In another embodiment, the first region is a first well of the second type, the base region is a second well of the first type, and the first well is within the second well. In an embodiment, the second well is constructed on a substrate of the integrated circuit. In alternative embodiment, the substrate is of the second type.

In a preferred embodiment, the base region is the substrate of the integrated circuit.

In a preferred embodiment, the first region is formed within the base region.

In a preferred embodiment, the transient negative voltage puming circuit includes a voltage transition circuit for generating at least a voltage transition during the ESD event. Alternatively, the transient negative voltage puming circuit includes a voltage transition circuit for generating at least a voltage-falling transition during the ESD event As recited, the voltage transiton has a ramp rate faster than the ESD transition voltage's ramp rate.

Figure 6:
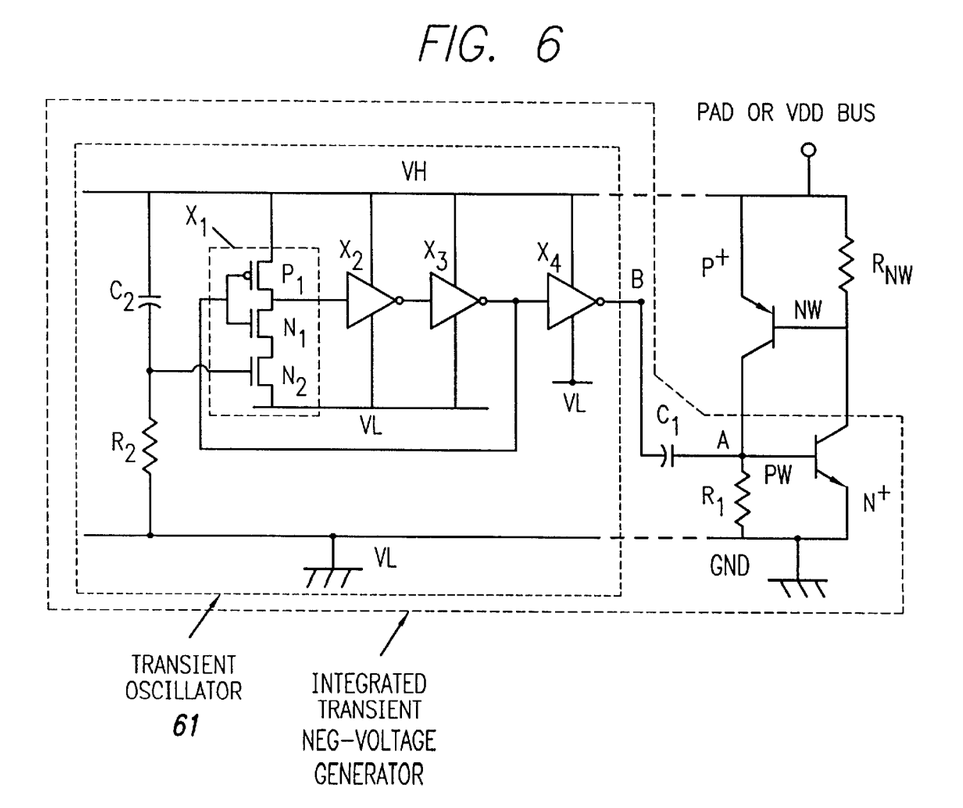
FIG. 6 shows details of the transient oscillator in FIG. 5.

Referring to FIG. 6, the transient oscillator circuit 61 is used to generate fast clocks with increasing amplitude during an ESD transient. As mentioned above, the capacitor C1 and the n+/pwell junction diode of the SCR structure together form an integrated voltage-pump circuit for generating a negative voltage during the initial phase of an ESD event. The pumped negative voltage directly applies to the pwell of the SCR structure such that the SCR's triggering occurs sooner during an ESD event.

Figure 9:
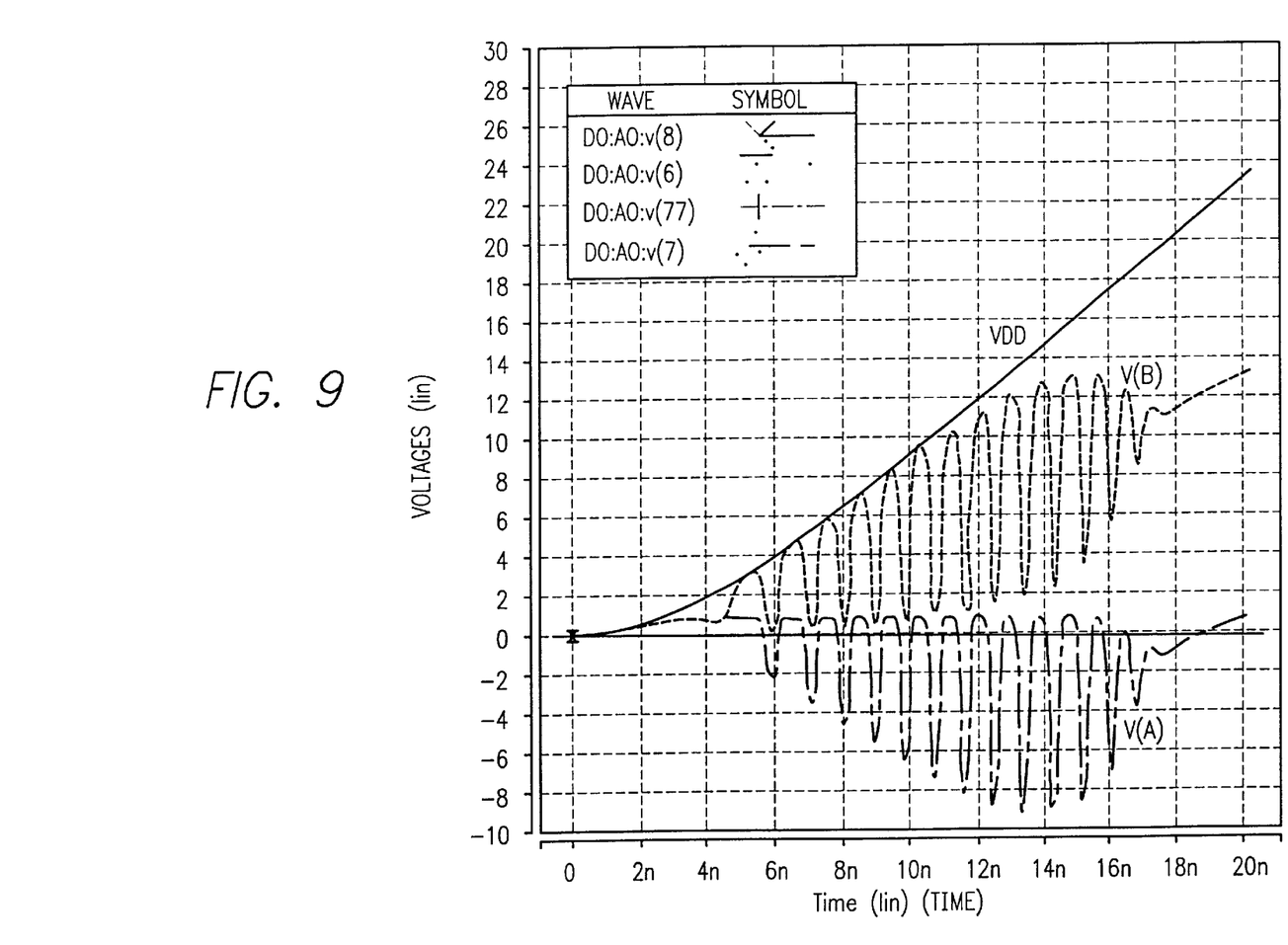
FIG. 9 shows the simulation result of the voltages at nodes A and B shown in FIG. 8.

As shown in FIG. 6, the oscillator 61 is formed by a serial connection of an odd number of (at least one) voltage inverting gates. In a preferred embodiment, the voltage inverting gate is an inverter. The VH of the oscillator 61 is electrically coupled to the VDD bus, or alternatively, electrically coupled to an IC pin via a pull-up device. The VL is electrically coupled to VSS. An optional buffer means (X4) can be used to improve the drive strength of the oscillating signal at node B. During a positive VDD-to-VSS or pin-to-VSS ESD event, the voltage difference of the VH and VL of the oscillator increases rapidly along with the transient ESD voltage. As a consequence, as shown in FIG. 9, the amplitude of the oscillating signal V(B) at node B also increases rapidly during the initial ESD transient, for instance, during the initial 10 ns of a Human-Body-Model ESD event.

Through the n+/pwell diode of SCR and a coupling capacitor C1, with the electrical connections shown in FIG. 6, the node A serves to provide a transient negative voltage. During the voltage increasing cycle of V(B), V(A) is kept no higher than 0.8 V through forward-biasing of the n+/pwell diode. During the voltage decreasing cycle of V(B), V(A) can reach value of −VH+0.8 volts. As the transient ESD voltage VH still less than 10 volt, VH-V(A) can reach 12 volts or higher for early trigger of the SCR device. And VH-V(A) is substantially equal to the voltage difference between nwell and pwell.

Also shown in FIG. 6, the first inverting gate X1 consists of a pull-up PMOSFET P1 and two stacked NMOSFETs N1 and N2. Note that N2 functions as an transient switch to activate or de-activate the inverting gate X1. The gates of P1, N1 are coupled to the output of the last inverting gate (X3) in series while the gate of N2 is coupled to VH through a capacitor $C_2$, and coupled to VL through a resistor $R_2$.

The R-C time constant is roughly 10 ns to 50 ns, which enables the oscillator circuit 61 to oscillate for at least around 10 ns, but not much longer than that, during an ESD transient or power-up transient. On the other hand, since a powering-up event typically takes longer, or much longer, than micro-seconds, N2 remains at a much lower voltage than the threshold voltage required to turn on N2. Therefore, the inverting gate X1 does not pull low and the oscillator circuit 61 does not oscillate during normal IC operation or powering up.

Since there are even number of inverting gates, X1 through X4, the pull-down speed of the buffer X4 is critical during an ESD transient. With the existence of N2, the combined N1 and N2 become the pull-down stacked gates of the inverting gate X1. This arrangement only affects the pull-down speed but not the pull-up speed of the gate X1. Accordingly, this arrangement of stacked gates will not affect the pull-down speed of the buffer X4 which is critical.

Alternatively, one may use stacked PMOSFETs as the pull-up circuit for X2 in FIG. 6, such that the pull-down speed of of the buffer X4 will not be affected. Shown in FIG. 6, as an option, the pwell is electrically connected to the ground through a resistor R1. R1 includes the nwell resistance and the resistance of a series resistor. The time constant of R1C1 is preferably larger than the voltage-rising phase of the ESD transient, for example R1C1>50 ns, such that the SCR is easy to trigger during an ESD event. R1C1 is also preferably less than the powering up transient, for example R1C1<1 µs, such that the SCR does not trigger during normal operation or powering up.

Figure 7:
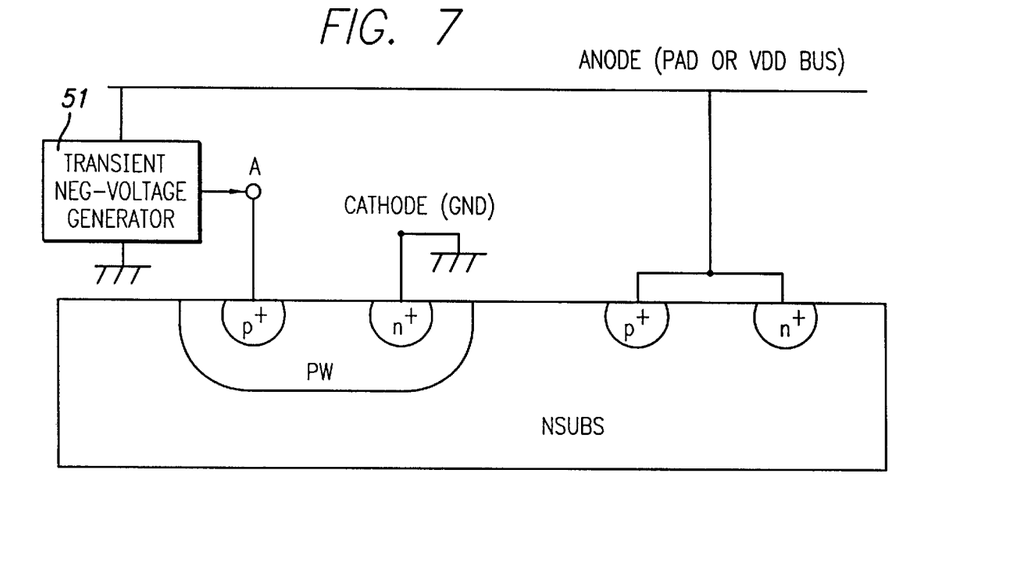
FIG. 7 shows section view of circuit in FIG. 5.

FIG. 7 shows the cross section of a conventional SCR structure with a transient negative voltage generator 51 applying the transient negative voltage to p+diffusion within the pwell. The SCR will trigger while the ESD transient voltage is still lower than the SCR trigger voltage. In another embodiment, the base region is a deep nwell, and the first region is a pwell formed in the deep nwell.

Figure 8:
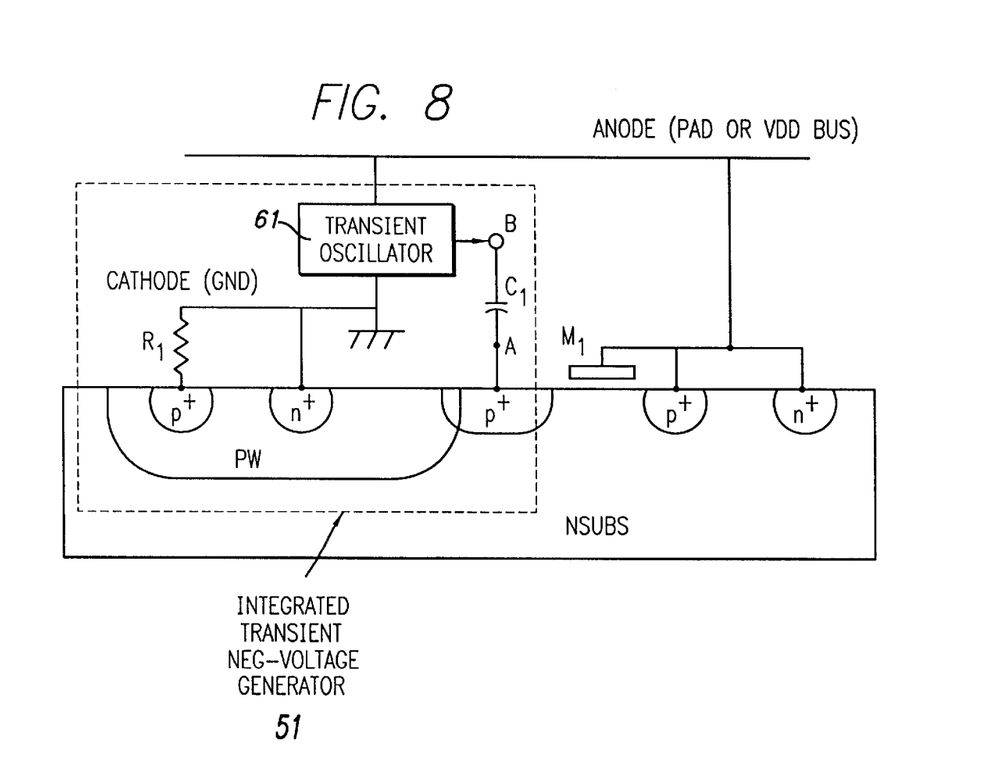
FIG. 8 shows section view of the invention when employing the teaching of U.S. Pat. No. 5,465,189.

FIG. 8 shows the cross section of an LVTSCR (Low-Voltage-Trigger SCR) structure with a transient negative voltage generator 51 applying the transient negative voltage to the pwell through an p+diffusion in the pwell. Since the drain junction of the PMOSFET overlaps with the pwell, the SCR will trigger at the PMOSFET trigger voltage, which is roughly 12 volts. And this occurs when the ESD transient voltage is still less than 10 volt due to the negative voltage pumping of the invention which forces the voltage difference between the nwell and pwell to be higher than the ESD transient voltage. Also shown in FIG. 8, the pwell is electrically connected to the ground through a resistor R1 which function as the resistor R1 in FIG. 6.

FIG. 9 shows the transient ESD voltage applied to VDD and the transient-voltage waveforms of V(B) and V(A) at nodes A and B. The simulation is based on 2.5 KV HBM (Human-Body-Model) and a 1 nF power bus (VDD to VSS) capacitance. As shown in the graph, a negative voltage V(A) is generated during the initial phase of the ESD event. When V(A) is applied to the pwell of an LVTSCR as shown in FIG. 8, the LVTSCR can be triggered at, for example, 12 volts between nwell and pwell (node A), while nwell connected to VDD is still at less than 8.5 volt. In other words, without the present invention, the LVTSCR can be triggered at approximately 12V. With the present invention, the LVTSCR can be triggered earlier when the ESD transient voltage is still less than 8.5 volt, thus providing earlier trigger of the LVTSCR and improved ESD protection for the internal circuits of the IC chip.

According to the present invention, the transient oscillator 61 functions to provide at least one voltage switching during the ESD transient to generate at least one transient negative voltage pulse to trigger the SCR device. Therefore, it is apparent to persons skillful in the arts that the transient oscillator 61 described in this invention can be substituted by any other switching circuit capable of providing one or multiple voltage switchings during the initial ESD transient which triggers the SCR to conduct large amount of ESD current.

What is claimed is:

1. An electrostatic discharge (ESD) protection structure for an integrated circuit constructed on a base region of a first type, comprising:
    a semiconductor controlled rectifier (SCR) constructed on the base region and coupled to said integrated circuit, said SCR including a first region of a second type formed next to said base region, a second region of the first type formed in said first region, and a third region of the second type formed in said base region;
    a voltage pumping circuit coupled to the first region, the voltage pumping circuit pumping an ESD transient voltage of a first polarity to a transient voltage of a second polarity during an ESD transient for earlier triggering of said SCR during an ESD event.

2. The structure of claim 1, wherein voltage pumping circuit generates at least a voltage transition during the ESD event.

3. The structure of claim 1, wherein the voltage pumping circuit generates at least a voltage-falling transition during the ESD event.

4. The structure of claim 2, wherein said voltage transition has a ramp rate faster than a ramp rate of the ESD transient voltage.

5. The structure of claim 2, wherein the ESD protection structure further comprises a capacitor and a first diode, the capacitor couples the voltage pumping circuit and the first diode.

6. The structure of claim 5, wherein said first diode is formed by the first region and the second region, and the first region couples to the said capacitor.

7. The structure of claim 6, wherein said second region couples to a ground bus.

8. The structure of claim 1, wherein the third region of the second type is coupled to an ESD transient voltage source.

9. The structure of claim 1, wherein the third region of the second type is coupled to a first bus which is electrically coupled to the ESD transient voltage source.

10. The structure of claim 9, wherein the first bus is a power bus.

11. The structure of claim 2, wherein the voltage pumping circuit comprises:
    an oscillation means having an output terminal for generating a voltage oscillation signal during an ESD event.

12. The structure of claim 11, further comprising
    a delay-switch means operative to turn on the oscillation means for at least a time period during the ESD event.

13. The structure of claim 12, wherein the oscillation means comprises:
    N voltage inverting gates serially connected to each other, N is an odd number, one of the N voltage inverting gates generates the voltage oscillation signal at an output terminal thereof.

14. The structure of claim 12, wherein the delay-switch means comprises:
    a switch means having an input node, an output node and a control node, wherein said input node connects to the output terminal of the last of N voltage inverting gates, said output node connects to an input terminal of the first of N voltage inverting gates;
    a control signal generator for generating a control signal to said control node of the switch means to turn on the switch means for at least a time period during the ESD event.

15. The structure of claim 14, wherein said control signal keeps said switch means off during normal operation of the integrated circuit.

16. The structure of claim 14, wherein said control signal keeps said switch means off during power-on operation of the integrated circuit.

17. The structure of claim 14, wherein said control signal generator includes an RC circuit having a resistor and a capacitor with one common joint terminal generating the control signal.

18. The structure of claim 14, wherein said switch means is a MOSFET transistor, and said control node is a gate of the MOSFET transistor.

19. The structure of claim 17, wherein one of the N voltage inverting gates comprises at least two stacked MOSFETs, a gate of one of said stacked MOSFETs receives the control signal.

20. The structure of claim 1, wherein the base region is a substrate of the integrated circuit.

21. The structure of claim 1, wherein the first region is a pwell, the second region is an n+ diffusion, the third region is a p+ diffusion, the base region is of n-type.

22. The structure of claim 21, wherein the base region is a deep nwell, the first region is a pwell formed in said deep nwell.

23. The structure of claim 11, wherein the transient voltage has a substantially opposite voltage polarity to said voltage oscillation signal.

24. A circuit for controlling time duration of a voltage pump circuit which generates voltage for triggering an ESD protection structure for an integrated circuit during an ESD event, comprises N voltage inverting gates serially connected to each other, N is an odd number, the last of the N voltage inverting gates generates an oscillation signal at an output terminal thereof, wherein one of the N voltage inverting gates comprises at least two stacked MOSFETs, a gate of one of said stacked MOSFETs receives a switch control signal during the ESD event.

25. The circuit of claim 24, wherein the ESD protection structure comprises a SCR structure.

26. The structure of claim 13, wherein said one of the N voltage inverting gates is the last of said N voltage inverting gates.

* * * * *